United States Patent
Reed et al.

(10) Patent No.: US 11,581,788 B2
(45) Date of Patent: Feb. 14, 2023

(54) HALL SENSOR FAULT DETECTION FOR GATE CROSSING MECHANISMS

(71) Applicant: Siemens Mobility, Inc., New York, NY (US)

(72) Inventors: Quinton Reed, Oil City, PA (US); Daniel Spencer, Pittsburgh, PA (US); Norbert Soós, Budapest (HU)

(73) Assignee: Siemens Mobility, Inc., New York, NY (US)

( * ) Notice: Subject to any disclaimer, the term of this patent is extended or adjusted under 35 U.S.C. 154(b) by 453 days.

(21) Appl. No.: 16/799,881

(22) Filed: Feb. 25, 2020

(65) Prior Publication Data
US 2021/0265898 A1 Aug. 26, 2021

(51) Int. Cl.
*H02K 11/21* (2016.01)
*H02K 11/215* (2016.01)
*G01D 5/14* (2006.01)
*H02K 29/08* (2006.01)

(52) U.S. Cl.
CPC .......... *H02K 11/215* (2016.01); *G01D 5/145* (2013.01); *H02K 29/08* (2013.01)

(58) Field of Classification Search
CPC ...... H02K 11/00; H02K 11/215; H02K 11/22; H02K 29/00; H02K 29/06; H02K 29/08; G01D 5/145
USPC .................................. 310/68 B, 71; 702/145
See application file for complete search history.

(56) References Cited

U.S. PATENT DOCUMENTS

| | | | |
|---|---|---|---|
| 10,895,866 B1* | 1/2021 | Bae | H02K 29/06 |
| 2015/0137718 A1 | 5/2015 | Liu et al. | |
| 2018/0335441 A1* | 11/2018 | Hammerschmidt | G01P 3/488 |
| 2020/0096577 A1* | 3/2020 | Fontanesi | G01R 33/072 |
| 2021/0096002 A1* | 4/2021 | Petri | G01D 5/2451 |

FOREIGN PATENT DOCUMENTS

KR 101957515 B1 3/2019

OTHER PUBLICATIONS

Kim et al., English Machine Translation of KR 101957515 (Year: 2019).*
Degang Lv, et al.; "Fault-tolerant of Hall-effect sensors in permanent magnet in-wheel motor drives"; College of Electrical and Electronic Engineering, Harbin University of Science and Technology, Harbin 150080, China; IEICE Electronics Express, 2017, vol. 14, No. 14, pp. 1-11.

* cited by examiner

*Primary Examiner* — Rashad H Johnson

(57) ABSTRACT

Examples described herein provide a computer-implemented method for predicting a state of a hall sensor for a motor having a plurality of hall sensors associated therewith. The example method includes receiving a previous state of the hall sensor. The example method further includes detecting a current state of the hall sensor. The example method further includes predicting a predicted next state of the hall sensor based on the previous state of the hall sensor, the current state of the hall sensor, and a direction of a shaft of the motor.

14 Claims, 8 Drawing Sheets

HALL SENSOR FAULT DETECTION FOR GATE CROSSING MECHANISMS

BACKGROUND

The present invention generally relates to a gate crossing mechanism, and more specifically, to techniques for hall sensor fault detection for gate crossing mechanism.

An intersection where a railway line crosses a road or path is referred to as a level crossing. Level crossings utilize gate crossing mechanisms to control traffic on the road or path when a train or other vehicle is passing through the level crossing. The gate crossing mechanisms prevent vehicles, pedestrians, etc., from crossing the railway line while the gate crossing mechanism is engaged.

SUMMARY

Embodiments of the present invention are directed to hall sensor fault detection for gate crossing mechanisms.

A non-limiting example computer-implemented method for predicting a state of a hall sensor for a motor having a plurality of hall sensors associated therewith includes receiving a previous state of the hall sensor. The example method further includes detecting a current state of the hall sensor. The example method further includes predicting a predicted next state of the hall sensor based on the previous state of the hall sensor, the current state of the hall sensor, and a direction of a shaft of the motor.

A non-limiting example computer-implemented method for detecting a faulty hall sensor for a motor having a plurality of hall sensors associated therewith includes receiving a current state of each of the plurality of hall sensors and determine a predicted next state for each of the plurality of hall sensors. The method further includes determining whether the predicted next state matches an actual next state for each of the plurality of hall sensors. The method further includes, responsive to determining that the predicted next state does not match an actual next state, adding an error to an incorrect hall sensor signal and flagging a hall signal responsive to the hall signal exceeding a maximum threshold. The method further includes, responsive to determining that the predicted next state does match an actual next state, subtracting the error from a correct hall sensor signal and unflagging the hall signal responsive to the hall signal being below the maximum threshold.

A non-limiting example system includes a motor having a shaft. The system further includes a plurality of hall sensors to measure an electromagnetic field about the shaft of the motor. The system further includes a processing device for executing computer readable instructions stored on a memory, the computer readable instructions controlling the processing device to perform operations. The operations include detecting a current state of at least one of the plurality of hall sensors. The operations further include predicting a predicted next state of the at least one of the plurality of hall sensors based on the current state. The operations further include determining whether the at least one of the plurality of hall sensors is faulty based at least in part on an actual next state and the predicted next state.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
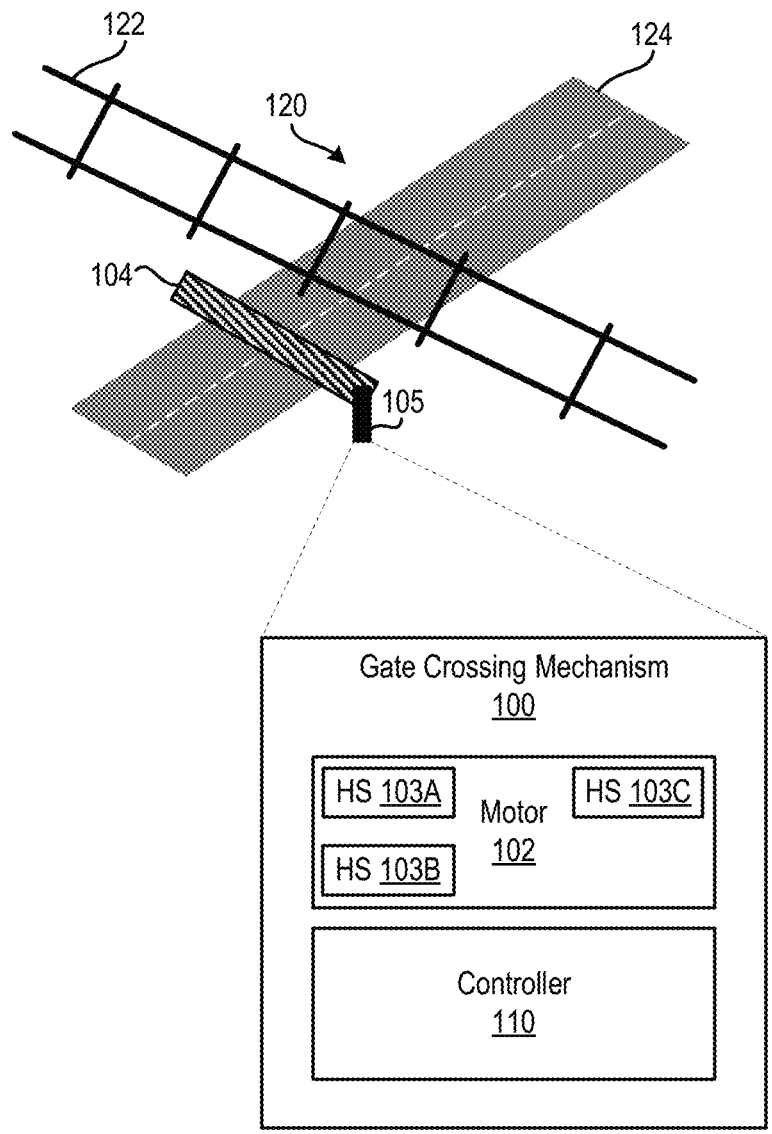
FIG. 1 depicts a block diagram of a processing system for a block diagram of a controller for a motor of a gate crossing mechanism according to one or more embodiments described herein.

The diagrams depicted herein are illustrative. There can be many variations to the diagram or the operations described therein without departing from the scope of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

One or more embodiments of the present invention provide for a gate crossing mechanism, including techniques for controlling a gate crossing motor and/or detecting and/or preventing faults of the gate crossing motor. A gate crossing mechanism protects motorists, pedestrians, and the like from oncoming trains by blocking level crossings or points at which public or private roads cross railway lines at the same level.

As one example, a gate crossing mechanism can include an arm or "gate" that, using a motor, selectively lowers/raises depending upon whether a train or other vehicle is passing through the level crossing. For example, if a train is approaching a level crossing, a gate can be lowered to prevent traffic on the road or path from crossing the railway line. A level crossing can be equipped with multiple gate crossing mechanisms. For example, each side of the railway line can include a gate crossing mechanism. In larger intersections, each side of the railway line can include two (or more) gate crossing mechanisms. Gate crossing mechanisms can further include lights, sirens, bells, or other similar devices that can provide visual and/or aural warnings.

Conventional gate crossing mechanisms can be susceptible to failures, malfunctions, etc., which can reduce their ability to control a level crossing safely. It is therefore describable to improve efficiency, reliability, and functionality of conventional gate crossing mechanisms.

The above-described aspects of the invention address the shortcomings of the prior art by providing techniques for improving the efficiency, reliability, and functionality of gate crossing mechanisms. Such aspects can include fault detection of a gate crossing motor, overspeed protection of a gate crossing motor, direction control of a gate crossing motor, and thermal lockout of a gate crossing motor.

Gate crossing mechanisms having the features and functionality described herein provide improve efficiency and address problems associated with conventional gate crossing mechanisms. For example, a gate crossing mechanism can include a brushless motor and digital control logic rather than a conventional brushed motor and mechanical cams. Motor brushes can experience uneven wear patterns, after which they must be replaced. This is both costly and time consuming for railways or those responsible for maintaining gate crossing mechanisms featuring brushed motors. Moreover, whereas conventional gate crossing mechanisms having brushed motors required eight cams, the brushless motors of the gate crossing mechanisms described herein can use substantially less than eight cams (e.g., two cams).

Additionally, the brushless motors of the gate crossing mechanisms described herein provide expanded fault detection such as overcurrent and overtemperature detection, which can be determined from measured three-phase motor currents. This active fault detection serves to increase the availability of the gate crossing mechanism. The brushless motors of the gate crossing mechanisms described herein also provide an improved user interface to give maintainers clear feedback on gate configuration. This improves efficiency and accuracy for maintainers to set gate attributes in the field, thereby decreasing human error. Finally, the brushless motors of the gate crossing mechanisms described herein support a configurable gate that can function as either an entrance or an exit gate, which can depend for example the FPGA firmware. This is a stark difference from the conventional gate crossing mechanisms, which can only function as an entrance gate unless an additional logic card is attached.

Turning now to FIG. 1, a block diagram of a controller 110 for a motor 102 of a gate crossing mechanism 100 is depicted according to one or more embodiments described herein. In this example, the gate crossing mechanism 100 includes the motor 102, the controller 110, and a gate 104. The gate 104 can be supported by any suitable structure, such as a gate support 105. The controller 110 and/or the motor 102 can be coupled to, incorporated in, or otherwise associated with the gate 104 and/or the gate support 105. The gate crossing mechanism 100 controls the gate 104 at a crossing 120 of a railway 122 and a road 124. The gate 104, when in a "down" or "closed" position, prevents traffic traveling along the road 124 from crossing the intersection 120. In examples, the intersection can be controlled by additional gate crossing mechanisms (not shown).

The motor 102 can have hall sensors (HS) 103A, 103B, 103C (collectively hall sensors 103) associated therewith. Although three hall sensors are shown and described, other numbers of hall sensors can be implemented in other examples. Hall sensors (or "hall effect sensors"), such as the hall sensors 103, are devices that measure a magnetic field, particularly the magnitude of the magnetic field, and output a voltage that is directly proportional to the magnetic field strength. Hall sensors are useful in the context of a motor (e.g., the motor 102) because they can be used to accurately determine position or speed of a shaft (not shown) extending from the motor 102 and connecting (directly or indirectly) to the gate 104 to control the gate 104.

It is desirable to increase the availability of the gate crossing mechanism 100 given that motor commutation is reliant on the hall sensors 103. Accordingly, the present techniques provide for hall sensor fault prediction and detection. In particular, the present techniques provide a proactive approach for hall sensor fault detection by predicting a hall sensor fault. The present techniques also provide a reactive approach for hall sensor fault detection by detecting a hall sensor failure when it occurs.

The present techniques account for the change of direction of the shaft of the motor 102. According to one or more embodiments described herein, the motor 102 includes a shaft (also referred to as an "arm") and a plurality of hall sensors (e.g., the hall sensors 103). The hall sensors 103 are configured to measure an electromagnetic field about the shaft of the motor and can be used to determine a position and/or speed of the shaft of the motor 102. The controller 110 (i.e., a processing device) can be used to execute instructions stored on a memory (not shown) for performing operations. Such operations can include, determining a current state of at least one of the plurality of hall sensors, predicting a predicted next state of the at least one of the plurality of hall sensors based on the current state, and determining whether the at least one of the plurality of hall sensors is faulty based at least in part on an actual next state and the predicted next state.

According to one or more embodiments described herein, upon change of direction in the shaft of the motor 102 or upon initial shaft movement, the first six hall state changes are ignored to avoid unnecessary and incorrect fault detection. Depending on how many bad hall signals there are, the detection technique can become less strict. If all hall sensors are good, then two sensors are needed to confirm a bad sensor. If two hall sensors are good, then only one hall sensor is needed to confirm the other is bad. If there is a change in the state of any hall sensor, then it is assumed to be good (i.e., non-faulty) and unflagged so it can be used to flag other hall sensors. This is a dynamic way of checking the hall sensors against one another and allows recovery if a hall sensor returns to operation (i.e., the hall sensor changes state).

Figure 2:
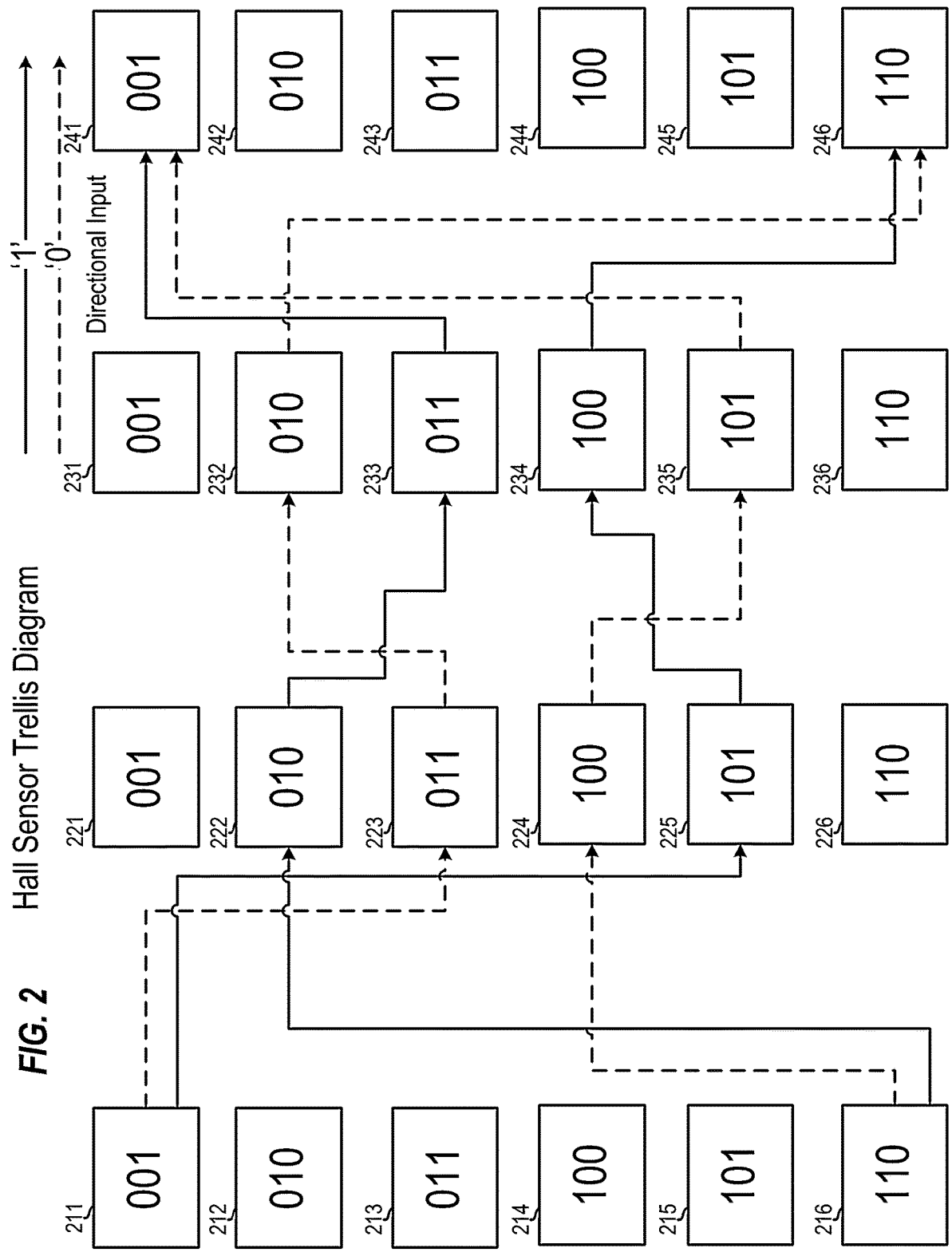
FIG. 2 depicts a trellis diagram for the hall sensors FIG. 1 according to one or more embodiments described herein.

FIG. 2 depicts a trellis diagram for the hall sensors 103 of FIG. 1 according to one or more embodiments described herein. The example trellis diagram of FIG. 2 assumes each of the hall sensors 103 are functioning nominally (i.e., these hall sensors are "good"). The trellis diagram of FIG. 2 shows the states of the hall sensors 103 at four different cycles. Particularly, the states of the hall sensors at a first cycle are shown as state blocks 211, 212, 213, 214, 215, 215; the states of the hall sensors at a second cycle are shown as state blocks 221, 222, 223, 224, 225, 225; the states of the hall sensors at a third cycle are shown as state blocks 231, 232, 233, 234, 235, 235; and the states of the hall sensors at a fourth cycle are shown as state blocks 241, 242, 243, 244, 245, 245. The solid arrows represent a "high" signal (i.e., a logical "1") while the dashed arrows represent a "low" signal (i.e., a logical "0").

The hall sensors 103 are positioned about the shaft of the motor 102 such that a point on the shaft, while the shaft rotates, first passes a field monitored by the hall sensor 103a, then passes a field monitored by the hall sensor 103b, and finally passes a field monitored by the hall sensor 103c. In this way, the hall sensors 103 form a field about the entire circumference of the shaft of the motor 102, and during a single revolution (360 degrees) of the shaft, any point on the shaft passes through the three fields of the three hall sensors 103.

Using the trellis diagrams of FIGS. 2-6, hall sensor fault detection can be accomplished by accumulating error over the whole shaft movement of the motor 102 as detected by the hall sensors 103. A trellis state diagram is used to determine what the next state of the hall sensors 103 should be based on the previous state of the hall sensors 103 and the movement direction of the shaft. As an example, if the prediction does not agree with the next value of one or more of the hall sensors 103, then an error (such as an error of 6) is applied to the hall sensor(s) that do not agree with the prediction. If the error exceeds a maximum set value (threshold), then that hall sensor is flagged as faulty/bad until it can negate the error. The negation of an error occurs as an amount of 1 for 1 correct hall state. According to examples, for every incorrect prediction, a certain number (e.g., 6) of consecutive correct predictions are used to negate the amount of error accumulated which represents a transition through all the hall states (as shown in FIG. 2) without an incorrect state.

Figure 3:
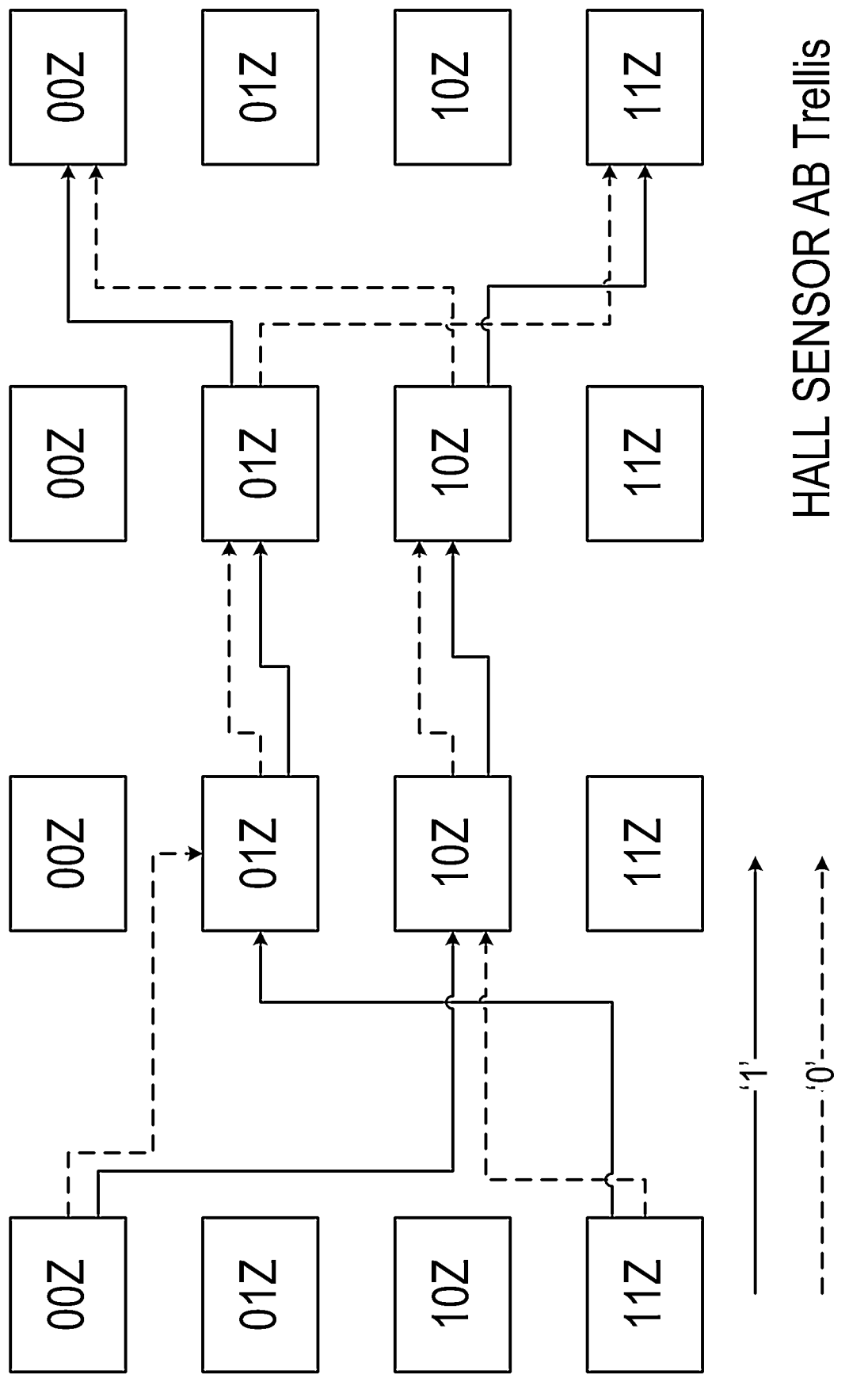
FIG. 3 depicts a trellis diagram for the hall sensors of FIG. 1 with one of the hall sensors being faulty according to one or more embodiments described herein.
Figure 4:
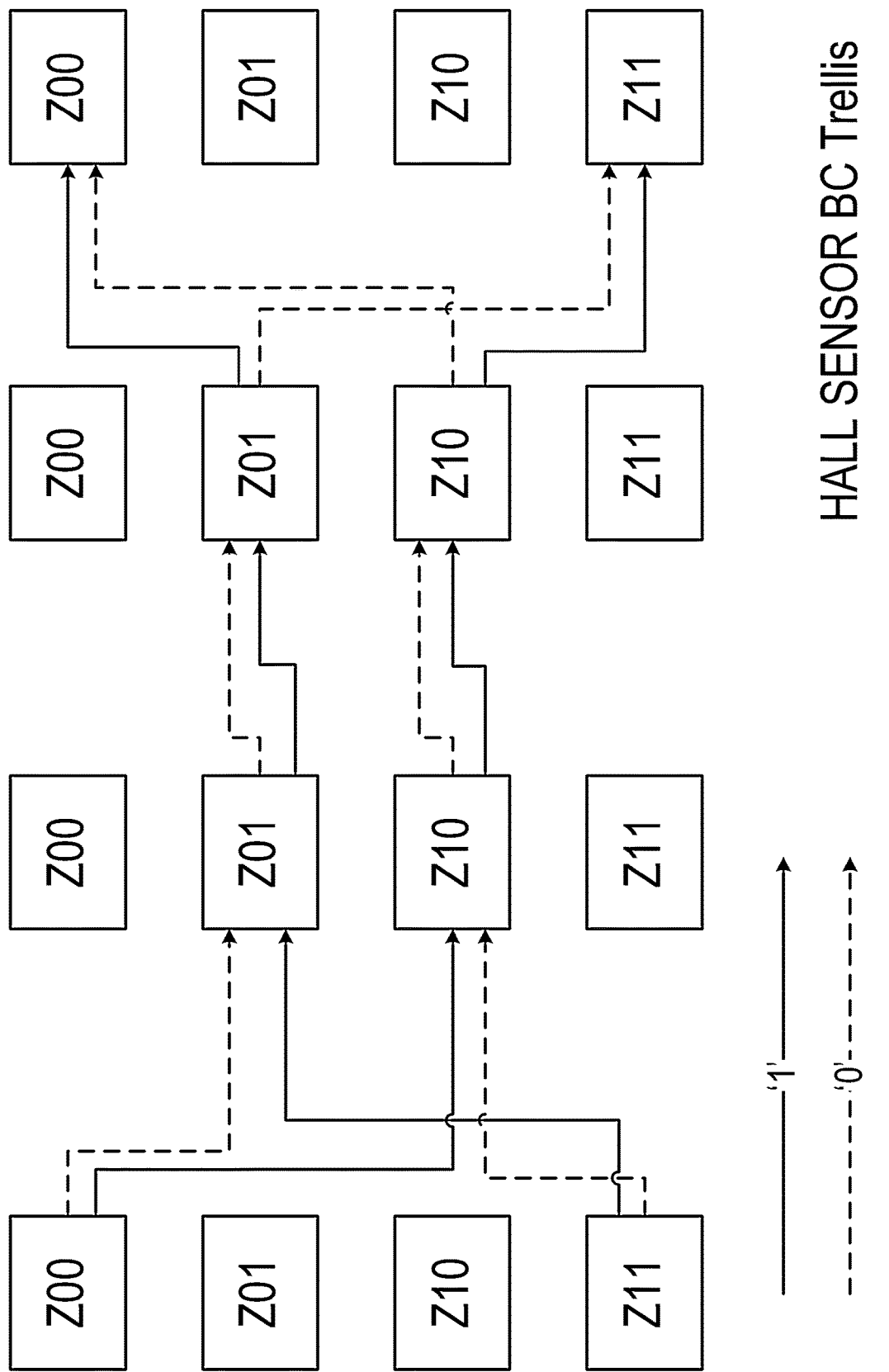
FIG. 4 depicts a trellis diagram for the hall sensors of FIG. 1 with one of the hall sensors being faulty according to one or more embodiments described herein.
Figure 5:
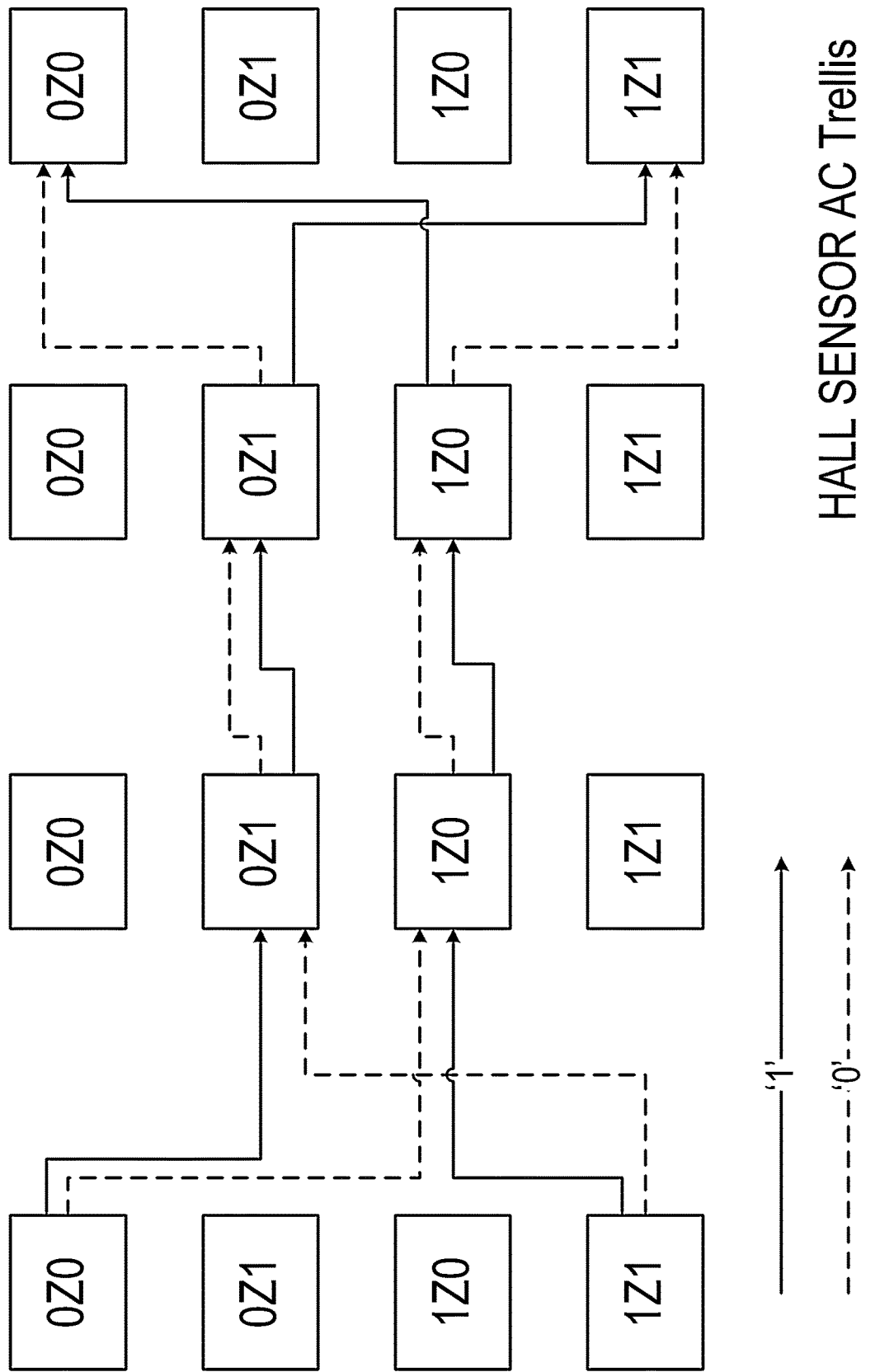
FIG. 5 depicts a trellis diagram for the hall sensors of FIG. 1 with one of the hall sensors being faulty according to one or more embodiments described herein.

Each of FIGS. 3-5 depict trellis diagrams for a single faulty hall sensor. In particular, FIG. 3 depicts a trellis diagram for the hall sensors 103 of FIG. 1 with hall sensor 103C being faulty according to one or more embodiments described herein. FIG. 4 depicts a trellis diagram for the hall sensors 103 of FIG. 1 with hall sensor 103A being faulty according to one or more embodiments described herein. FIG. 5 depicts a trellis diagram for the hall sensors 103 of FIG. 1 with hall sensor 103B being faulty according to one or more embodiments described herein.

In each of FIGS. 2-5, each state block indicates three values, with the first value corresponding to a signal of the hall sensors 103a, the second value corresponding to a signal of the hall sensors 103b, and the third value corresponding to a signal of the hall sensors 103c. Consider, for example, the state block 211 having a value "001" which indicates that the signal from the hall sensor 103a is low ("0"), the signal from the hall sensor 103b is low ("0"), and the signal from the hall sensor 103c is high ("1"). In the examples of FIGS. 3-5, the value "Z" indicates high impedance through a bad hall sensor. This could mean that the bad hall sensor is stuck low ("0") or high ("1").

With reference to the trellis diagram of FIG. 2, consider the state block 211. A next state block would be expected to be "011" indicated by the state block 223. If the actual state of the hall sensor 103b does not change from "0" to "1" as predicted by the change from state block 211 to state block 223, error accumulation begins for each of the individual hall sensors 103a, 103b, 103c (see FIG. 6). If the next state is "101" indicated by the state block 225, then the second hall sensor 103b did not transition as expected.

If a detected state is "011" (state block 223), and the previous state is "001" (state block 211), it is known that the direction is "0" and a next state can be predicted as "010" (state block 232). Similarly, if a detected state is "101" (state block 225) and the previous state is "001" (state block 211), it is known that the direction is "1" and a next state can be predicted as "110" (state block 234). The predicted next state is compared to an actual next state, and if they match, the hall sensor is considered to be functioning properly. However, if the predicted next state and the actual next state do not match, error is then added (see FIG. 6) and waiting for a next transition beings. Upon detection of a next transition of the shaft of the motor 102 (meaning a change in direction of the rotation of the shaft of the motor 102) the detected state is compared to the trellis diagram of FIG. 2 to predict a next state.

If a single hall sensor is bad, prediction can continue with two hall sensors based on the trellis diagrams depicted in FIGS. 3-5 as applied to FIG. 7 described in more detail herein.

Faulty hall sensor detection is now described. Upon change of direction in the shaft of the motor 102 or initial shaft movement, a startup period number of hall state changes (e.g., 6) are ignored to avoid unnecessary and incorrect fault detection. Depending on how many bad hall signals there are, the detection techniques described herein become less strict. If all (e.g., 3) hall sensors are good, then two sensors are needed to confirm a bad sensor. If two hall sensors are good, then only one hall sensor is needed to confirm the other is bad. If there is a change in state of any hall sensor, then that hall sensor is assumed to be good, and it is unflagged so it can be used to flag other hall sensors. This provides a dynamic technique for checking the hall sensors against one another, which allows recovery if a hall sensor returns to operation (i.e., the hall sensor changes state). Also provided is a detection technique that accumulates error over the whole arm movement. In particular, faulty hall sensor detection is described with reference to FIGS. 6, 7A, and 7B.

Figure 6:
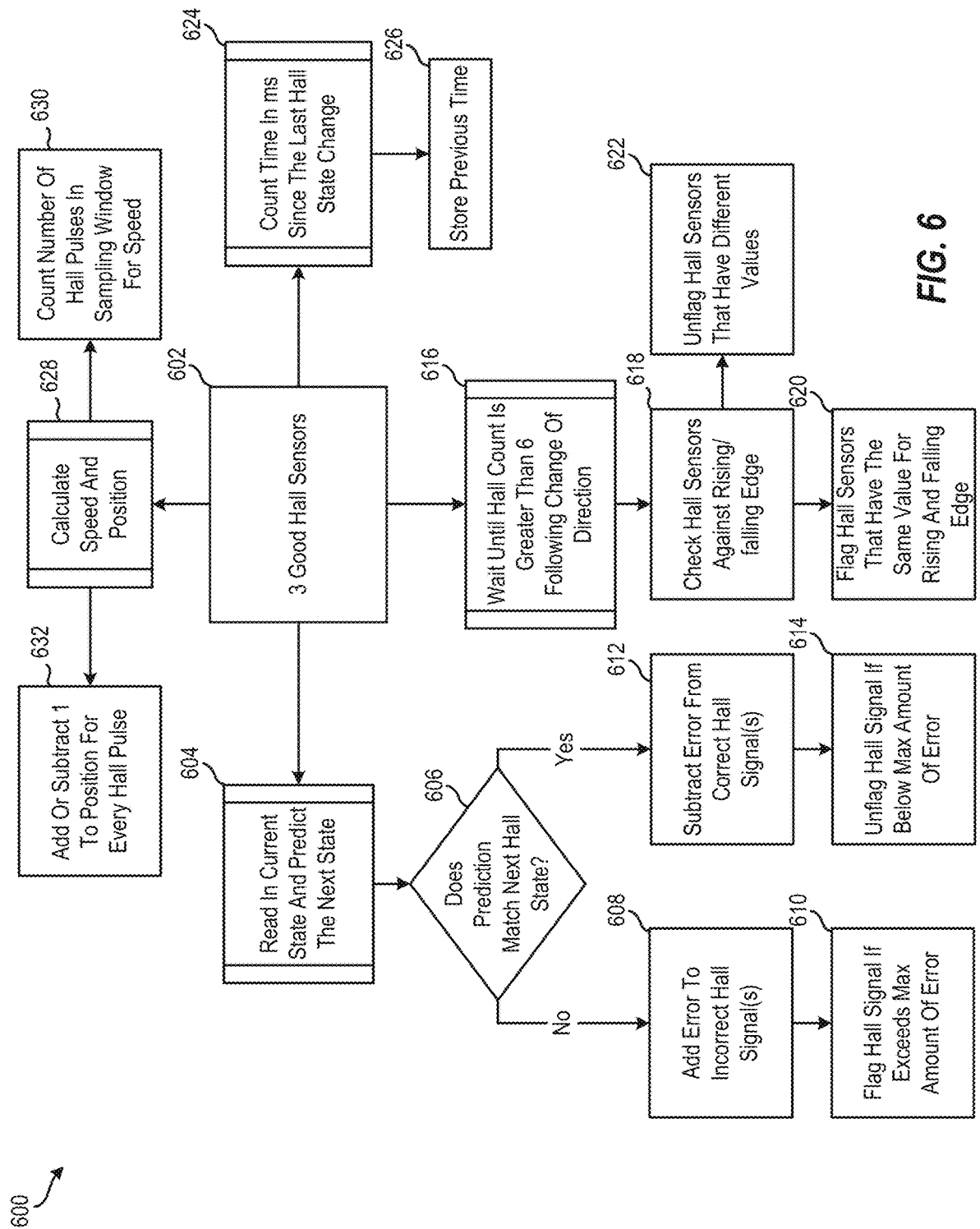
FIG. 6 depicts a flow diagram of a method for detecting a hall sensor fault for three good hall sensors according to one or more embodiments described herein.

FIG. 6 depicts a flow diagram of a method 600 for detecting a hall sensor fault for three good hall sensors (e.g., the hall sensors 103 of FIG. 1) according to one or more embodiments described herein. The method 600 begins at block 602 with three good hall sensors. At block 604, a current state and a predicted next state are determined (see the prediction models described with respect to FIGS. 2-5) for each of the hall sensors. At block 606, it is determined whether the predicted next state matches the actual next state. If the prediction does not match the actual next state, an error is added to the incorrect hall sensor at block 608, and a flag is set to flag the hall sensor if the error exceeds a maximum amount of error (i.e., maximum threshold). If the prediction matches the actual next state at block 606, an error is subtracted from the incorrect hall sensor at block 612, and the flag is cleared if the error is below the maximum amount of error (i.e., maximum threshold). This approach enables detecting a bad hall sensor over a period of time by accumulating error (e.g., block 608) and/or reducing error (e.g., block 612).

As an example, if the prediction does not agree with the next value of one or more of the hall sensors 103 at block 606, then an error (such as an error of 6) is applied to the hall sensor(s) that do not agree with the prediction. If the error exceeds a maximum set value (i.e., the maximum threshold), then that hall sensor is flagged as faulty/bad until it can negate the error. The negation of an error occurs as an amount of 1 for 1 correct hall state. According to examples, for every incorrect prediction, a certain number (e.g., 6) of consecutive correct predictions are used to negate the amount of error accumulated which represents a transition through all the hall states (as shown in FIG. 2) without an incorrect state.

The method 600 also proceeds from block 602 to block 616 for detecting a bad hall sensor upon a start from stop/idle condition of the motor 102. At block 616, a rise/fall is detected by waiting until a hall count is greater than a startup number of cycles (e.g., 6 cycles) following a change of direction. At block 618, the hall sensor signals are checked against a rising/falling edge. Hall sensors that have the same value for the rising and falling edge are flagged at block 620 while hall sensors that have different values are unflagged at block 622. Hall sensors that have the same value for the rising and falling edge could indicate that the hall sensor is faulty, and thus the hall sensor is flagged. However, hall sensors that have a change in value are unflagged because they are presumed to be functioning properly.

The method 600 also proceeds from block 602 to block 624 where a time (in milliseconds (ms) is counted since the last hall state change. The time since previous is stored as a previous time at block 626.

The method 600 also proceeds from block 602 to block 628, where a speed and position of the shaft of the motor 102 is calculated. At block 632, a value of 1 is added to or subtracted from the position for every hall pulse for calculating the position of the shaft of the motor 102. At block 630, a number of hall pulses in a sampling window are counted for calculating the speed of the shaft of the motor 102.

Figure 7A:
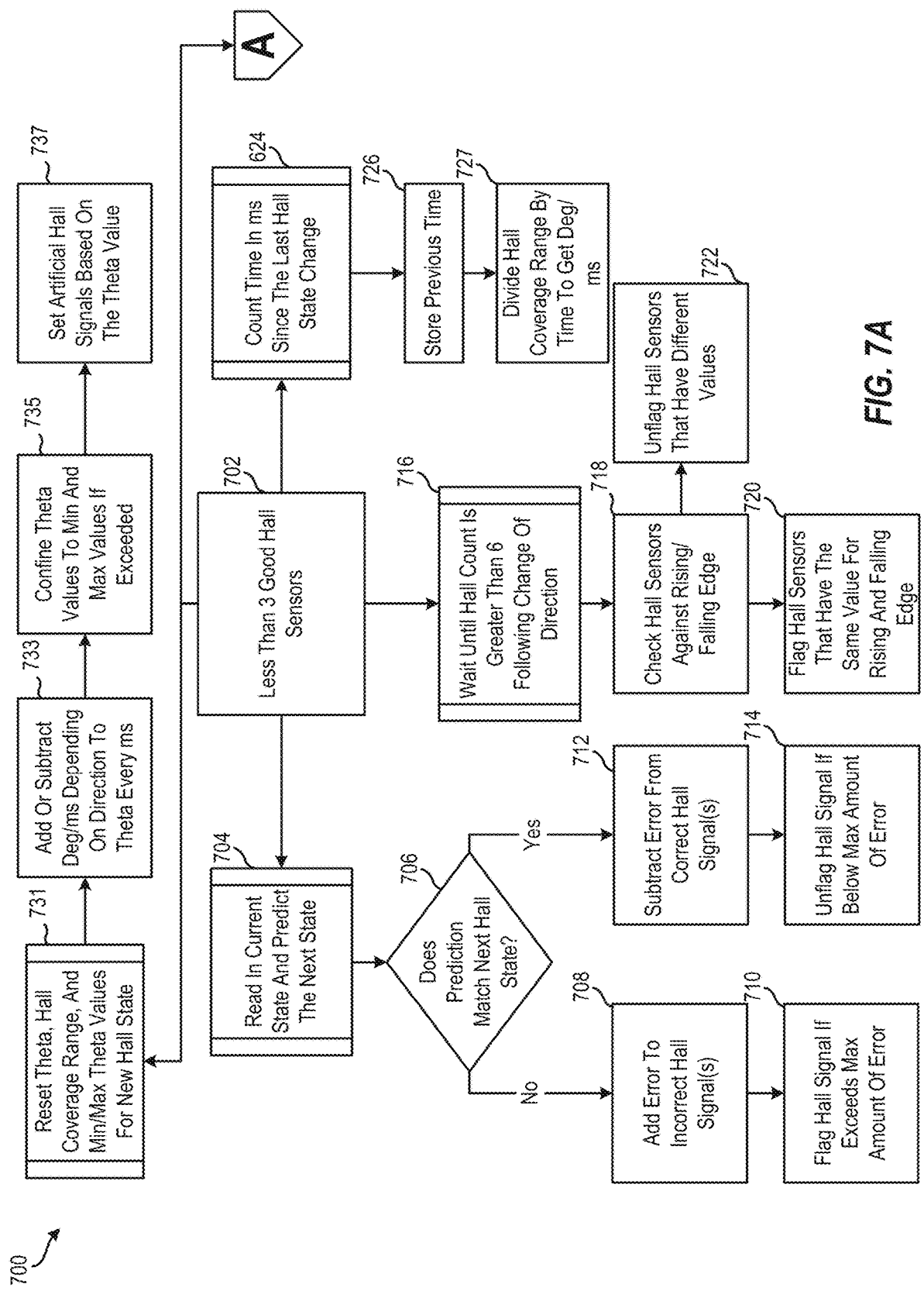
FIGS. 7A and 7B depict a flow diagram of a method for detecting a hall sensor fault for less than three good hall sensors according to one or more embodiments described herein.
Figure 7B:
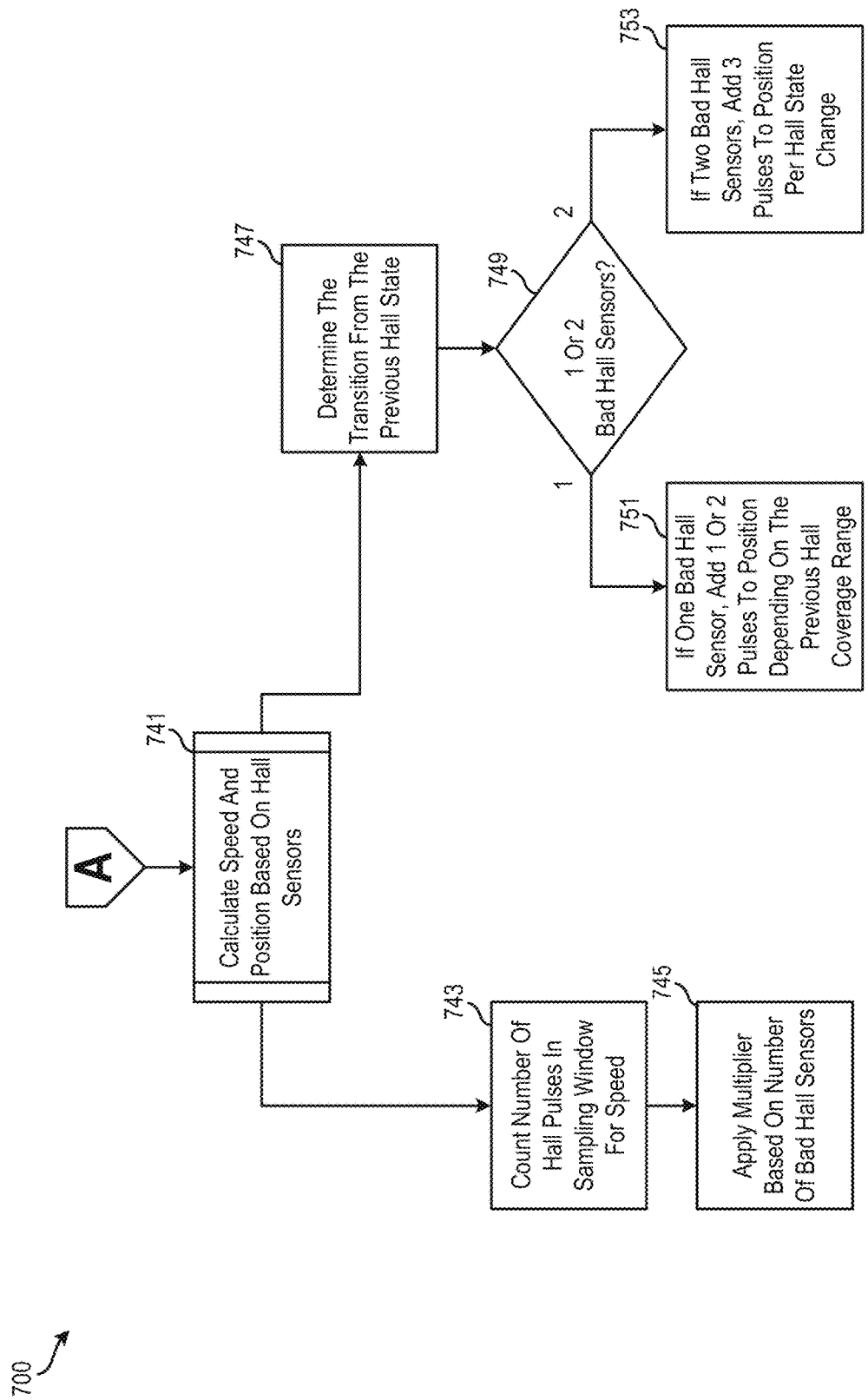

FIGS. 7A and 7B depict a flow diagram of a method 700 for detecting a hall sensor fault for less than three good hall sensors (e.g., the hall sensors 103 of FIG. 1) according to one or more embodiments described herein. The method 700 begins at block 702 with less than three (i.e., 1 or 2) good hall sensors. At block 704, a current state and a predicted next state are determined (see the prediction models described with respect to FIGS. 2-5) for each of the hall sensors. At block 706, it is determined whether the predicted next state matches the actual next state. If the prediction does not match the actual next state, an error is added to the incorrect hall sensor at block 708, and a flag is set to flag the hall sensor if the error exceeds a maximum amount of error (i.e., maximum threshold). If the prediction matches the actual next state at block 706, an error is subtracted from the incorrect hall sensor at block 712, and the flag is cleared if the error is below the maximum amount of error (i.e., maximum threshold). This approach enables detecting a bad hall sensor over a period of time by accumulating error (e.g., block 708) and/or reducing error (e.g., block 712).

As an example, if the prediction does not agree with the next value of one or more of the hall sensors 103 at block 706, then an error (such as an error of 6) is applied to the hall sensor(s) that do not agree with the prediction. If the error exceeds a maximum set value (i.e., the maximum threshold), then that hall sensor is flagged as faulty/bad until it can negate the error. The negation of an error occurs as an amount of 1 for 1 correct hall state. According to examples, for every incorrect prediction, a certain number (e.g., 6) of consecutive correct predictions are used to negate the amount of error accumulated which represents a transition through all the hall states (as shown in FIG. 2) without an incorrect state.

The method 700 also proceeds from block 702 to block 716 for detecting a bad hall sensor upon a start from stop/idle condition of the motor 102. At block 716, a rise/fall is detected by waiting until a hall count is greater than a startup number of cycles (e.g., 6 cycles) following a change of direction. At block 718, the hall sensor signals are checked against a rising/falling edge. Hall sensors that have the same value for the rising and falling edge are flagged at block 720 while hall sensors that have different values are unflagged at block 722. Hall sensors that have the same value for the rising and falling edge could indicate that the hall sensor is faulty, and thus the hall sensor is flagged. However, hall sensors that have a change in value are unflagged because they are presumed to be functioning properly.

The method 700 also proceeds from block 702 to block 724 where a time (in milliseconds (ms) is counted since the last hall state change. The time since previous is stored as a previous time at block 726. A hall coverage range (i.e., an amount of coverage around the shaft covered by the particular hall sensor) is divided by the stored previous time to determine a degree/millisecond value at block 727. This indicates how much distance since the last hall transition occurred in motor degrees, thus providing a hall coverage range.

The method 700 also proceeds from block 702 to block 731 where a value theta (which represents an angle of rotation of the shaft of the motor 102), the hall coverage range (from block 727 and dependent on the number of bad hall sensors), and the minimum and maximum values for theta (i.e., the min/max rotor position for current hall state) are reset at a change in hall state. At block 733, a value in degrees/millisecond (i.e., the speed) is added or subtracted from the coverage range depending on the direction to theta every millisecond (i.e., the calculated rotor position). At block 735, the theta values are confined to minimum and maximum values if exceeded. At block 737, an artificial hall signal is set based on the theta (i.e., the current rotor position) value (or confined theta values). According to one or more embodiments described herein, the artificial hall signals are generated from a calculated theta that represents an estimated rotor position based on minimum and maximum values for theta (i.e., min/max rotor position for hall state), a previous theta (i.e., an old estimated rotor position), and speed of the rotor, which can be measured degrees/millisecond, for example.

The method 700 also proceeds from block 702 to block 741 (see FIG. 7B), where a speed and position of the shaft of the motor 102 are calculated based on signals from the hall sensors 103.

For example, the speed and position are compensated for based on the number of hall signals that are good. For example, for three good hall sensors (see FIGS. 2, 6), each state transition is worth 1 hall pulse or 1+/− to position. For two good hall sensors (see FIGS. 3-5, 7A, 7B), certain state transitions equate to 1+/− hall pulse while others are 2+/− hall pulses to position. If only one hall sensor is good, all transitions will equate to 3+/− hall pulses.

Speed is similar to position in the sense that two good hall sensors result in the measured speed being multiplied by 3/2, and for one good hall sensor, speed is adjust by multiplying by 3. This allows for continued accurate positioning of the shaft of the motor 102 and the maintaining of speed control throughout the shaft's movement. Without accurate position or speed, the gate crossing mechanism 101 would exhibit erratic and/or slow movement and/or overrun position in the top and bottom of the movement of the gate 104.

At block 743, a number of hall pulses in a sampling window are counted for calculating the speed. At block 745, a multiplier (e.g., 3/2 for two good hall sensors, 3 for one good hall sensor) is applied based on a number of bad hall sensors.=

At block 747, a transition from the previous hall sate is determined (see FIGS. 2-5). At block 749, it is determined whether there are 1 or 2 bad hall sensors. At block 751, if one bad hall sensor is determined, 1 or 2 pulses are added to the position depending on the previous hall coverage range (see block 727). At block 753, if two bad hall sensor are determined, 3 pulses are added to the position according to the hall state change.

The embodiments described herein may be implemented as one or more systems, methods, and/or computer program products at any possible technical detail level of integration. The computer program product may include a computer readable storage medium (or media) having computer readable program instructions thereon for causing a processor to carry out aspects of the present invention.

The various components, modules, blocks, engines, etc. described herein can be implemented as instructions stored on a computer-readable storage medium, as hardware modules, as special-purpose hardware (e.g., application specific hardware, application specific integrated circuits (ASICs), application specific special processors (ASSPs), field programmable gate arrays (FPGAs), as embedded controllers, hardwired circuitry, etc.), or as some combination or combinations of these. According to aspects of the present disclosure, the various components, modules, blocks, engines, etc. described herein can be a combination of hardware and programming. The programming can be processor executable instructions stored on a tangible memory, and the hardware can include a processing device for executing those instructions. Thus a system memory can store program instructions that when executed by the processing device implement the engines described herein. Other engines can also be utilized to include other features and functionality described in other examples herein. In examples, the features and functions described herein can be implemented as an algorithm in an FPGA using a hardware description language. That is, one or more of the blocks of the method 300 can be implemented on or using an FPGA according to one or more embodiments described herein. Similarly, one or more of the blocks of the method 300 can be implemented on or using a general purpose processor, either individually and/or in combination with an FPGA, as described herein.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method for detecting a faulty hall sensor for a motor having a plurality of hall sensors associated therewith, the method comprising:
   receiving a current state of each of the plurality of hall sensors and determine a predicted next state for each of the plurality of hall sensors;
   determining whether the predicted next state matches an actual next state for each of the plurality of hall sensors;
   responsive to determining that the predicted next state does not match an actual next state, adding an error to an incorrect hall sensor signal and flagging a hall signal responsive to the hall signal exceeding a maximum threshold; and
   responsive to determining that the predicted next state does match an actual next state, subtracting the error from a correct hall sensor signal and unflagging the hall signal responsive to the hall signal being below the maximum threshold.

2. The computer-implemented method of claim 1, further comprising:
   detecting that a hall count reaches a count threshold; and
   responsive to detecting that the hall count reaches the count threshold, checking the plurality of hall sensors against rising and falling edge values to determine whether the hall signal for each of the plurality of hall sensors is the same or different than the rising and falling edge values.

3. The computer-implemented method of claim 2, further comprising:
   responsive to determining that the hall signal for one or more of the plurality of hall sensors is the same as the rising and falling edge values, flagging the one or more of the plurality of hall sensors that have the same rising and falling edge values.

4. The computer-implemented method of claim 2, further comprising:
   responsive to determining that the hall signal for one or more of the plurality of hall sensors is different than the rising and falling edge values, unflagging the one or more of the plurality of hall sensors that have different rising and falling edge values.

5. The computer-implemented method of claim 1, further comprising:
   counting a time since a last hall state change; and
   storing the time.

6. The computer-implemented method of claim 1, further comprising:
   calculating a speed and position of the motor based at least in part on the plurality of hall sensors.

7. The computer-implemented method of claim 6, further comprising:
   adding or subtracting a value of one to each position for each of a plurality of hall sensor pulses.

8. The computer-implemented method of claim 6, further comprising:
   generating artificial hall signals from a calculated theta that represents an estimated rotor position of a rotor based on minimum and maximum values for theta, a previous theta, and a speed of the rotor.

9. The computer-implemented method of claim 6, further comprising:
   counting a number of hall sensor pulses in a sampling window to determine the speed of the motor.

10. A system comprising:
    a motor comprising a shaft;
    a plurality of hall sensors to measure an electromagnetic field about the shaft of the motor;
    a processing device for executing computer readable instructions stored on a memory, the computer readable instructions controlling the processing device to perform operations comprising:
    detecting a current state of at least one of the plurality of hall sensors;
    predicting a predicted next state of the at least one of the plurality of hall sensors based on the current state;
    determining whether the at least one of the plurality of hall sensors is faulty based at least in part on an actual next state and the predicted next state; and
    responsive to determining that the predicted next state does match the actual next state, subtracting an error from a correct hall sensor signal and unflagging the hall signal responsive to the hall signal being below a maximum threshold.

11. The system of claim 10, wherein it is determined that the at least one of the plurality of hall sensors is not faulty responsive to determining that the predicted next state and the actual next state are different.

12. The system of claim 10, wherein the operations further comprise:
    determining a speed and a position of the shaft of the motor based at least in part on a signal generated by each of the plurality of hall sensors.

13. The system of claim 10, wherein the operations further comprise:
    responsive to determining that the predicted next state does not match the actual next state, adding an error to an incorrect hall sensor signal and flagging a hall signal responsive to the hall signal exceeding a maximum threshold.

14. The system of claim 10, wherein the operations further comprise:
    receiving a previous state of the at least one of the plurality of hall sensors; and
    predicting the predicted next state of the hall sensor based on the previous state of the hall sensor, the current state of the hall sensor, and a direction of a shaft of the motor.

* * * * *